United States Patent [19]

Boschman

[11] Patent Number: 4,653,993
[45] Date of Patent: Mar. 31, 1987

[54] APPARATUS FOR ENCAPSULATING ELECTRONIC COMPONENTS IN PLASTIC MATERIAL

[75] Inventor: Everardus H. Boschman, Aerdt Gld., Netherlands

[73] Assignee: Boschman Kleinpenning Beheer B.V., Zevenaar, Netherlands

[21] Appl. No.: 523,749

[22] Filed: Aug. 16, 1983

[30] Foreign Application Priority Data

Aug. 19, 1982 [NL] Netherlands ............ 8203253

[51] Int. Cl.⁴ .................. B29C 45/14; B29C 31/04
[52] U.S. Cl. ................. 425/116; 264/272.17; 425/121; 425/126 R; 425/129 R; 425/543
[58] Field of Search ........ 264/272.14, 272.17; 29/588; 425/116, 121, 125, 126 R, 129 R, 308, 543; 249/95

[56] References Cited

U.S. PATENT DOCUMENTS

| | | | |
|---|---|---|---|
| 3,471,900 | 10/1969 | Burns | 264/272.11 |
| 3,915,780 | 10/1975 | Broussard, Jr. et al. | 264/272.17 |
| 4,109,373 | 8/1978 | Fennessy et al. | 264/272.17 |
| 4,173,821 | 11/1979 | Yamamoto | 264/272.17 |
| 4,250,347 | 2/1981 | Fierkens | 264/272.17 |
| 4,347,211 | 8/1982 | Bandoh | 425/544 |
| 4,368,168 | 1/1983 | Slepcevic | 264/272.14 |
| 4,386,898 | 6/1983 | Sera | 425/544 |
| 4,388,265 | 6/1983 | Bandoh | 425/544 |
| 4,460,537 | 7/1984 | Heinle | 29/588 |

FOREIGN PATENT DOCUMENTS

| | | | |
|---|---|---|---|
| 7762 | 7/1979 | European Pat. Off. | |
| 50-29860 | 9/1975 | Japan | 425/544 |
| 54-162963 | 12/1979 | Japan | 29/588 |
| 56-49533 | 5/1981 | Japan | 29/588 |
| 7704937 | 11/1978 | Netherlands . | |
| 960097 | 6/1964 | United Kingdom | 264/272.14 |

OTHER PUBLICATIONS

PCT/JP82/00023, Aug. 5, 1982.

Primary Examiner—James Lowe
Attorney, Agent, or Firm—Weiser & Stapler

[57] ABSTRACT

Apparatus for encapsulating parts of elements into a plastic material to manufacture electronic components. The mould has one or more parallel rows of mould cavities, into which a plastic material is injected through one or more sprues. The elements are part of a strip of which the length is a multiplicity of the length of a row of cavities, which strip is step by step treated in said mould such that an uninterrupted strip of components is obtained.

8 Claims, 3 Drawing Figures

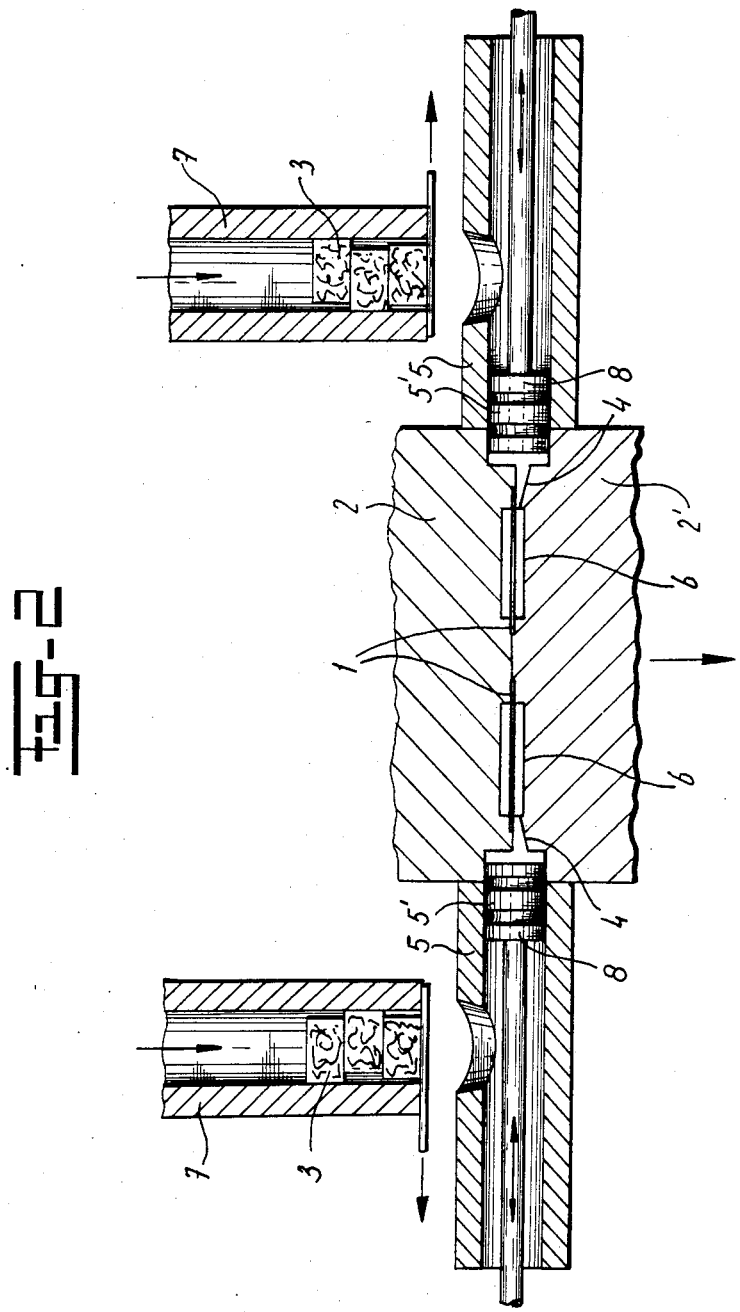

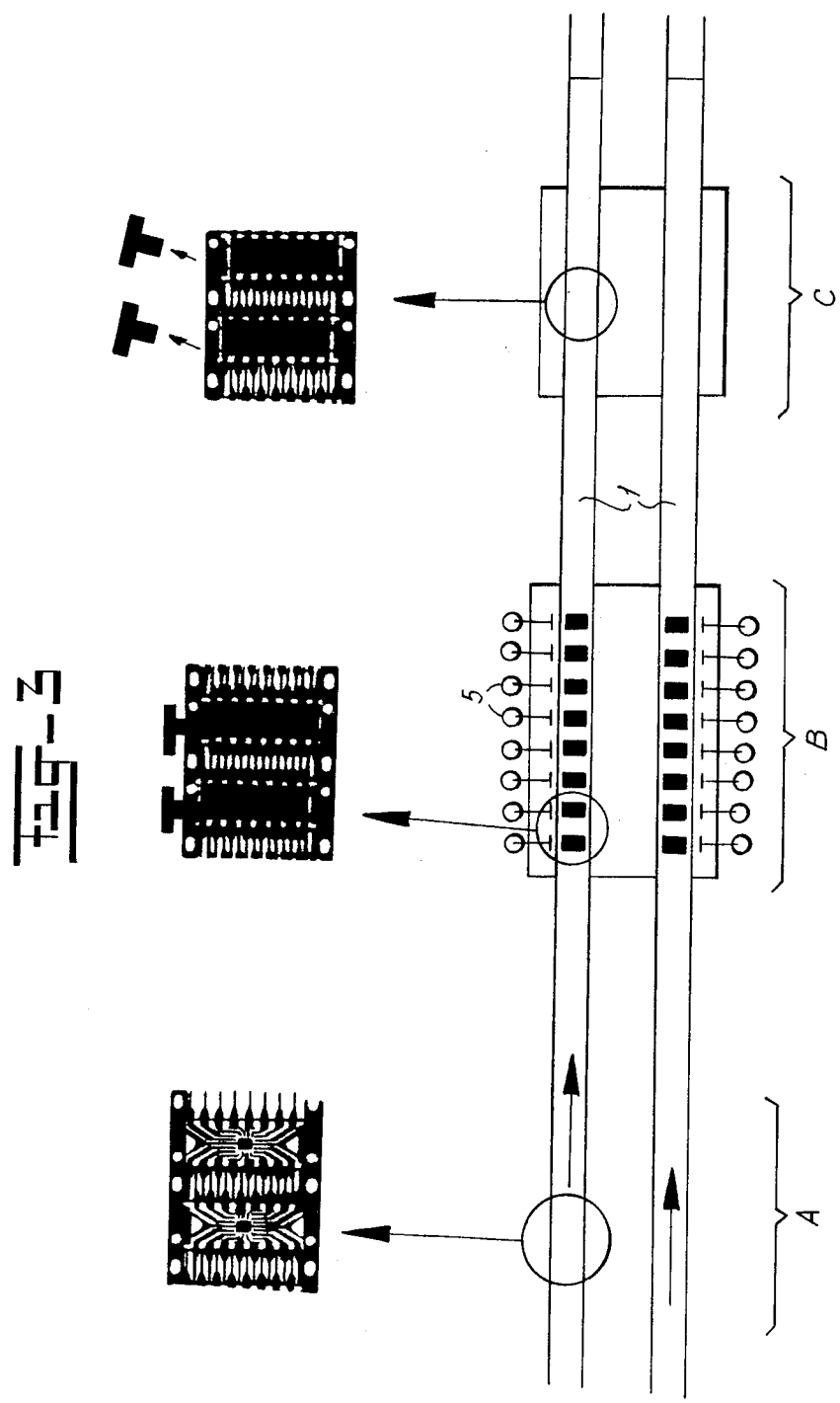

APPARATUS FOR ENCAPSULATING ELECTRONIC COMPONENTS IN PLASTIC MATERIAL

BACKGROUND OF THE INVENTION

The invention relates to a method for encapsulating parts of elements into a plastic material to manufacture electronic components, which parts are contained in one or more parallel rows into the mould cavities of a mould, in which plastic material is injected through one or more sprues.

Methods for encapsulating parts of elements into plastic material are known. In the state of the art a number of moulds are positioned around a central press cylinder, from which plastic material is through long sprues supplied to the moulds. Said moulds have a large number of aligned mould cavities and after opening the mould sections, a strip of elements to be encapsulated are placed into the moulds by hand. That implies, that these sections have to be separated from the strip, that the moulds have to be opened for taking out a treated section by hand and for placing therein a new section to be treated, resulting into a long cycle period. Furthermore long sprues are necessary also outside the moulds, for which a large amount of plastic material is necessary. After opening the moulds it is frequently necessary to clean the moulds. During a production period of for instance seven hours the cleaning operation has to be carried out several times.

SUMMARY OF THE INVENTION

It is the object of the invention to avoid the above mentioned disadvantages and to make automation possible.

In agreement with said object the invention now provides a method in which said elements are combined into a strip of which the length is a multiplicity of the length of a row of elements, which strip is step by step treated in said mould such that an uninterrupted strip of components is obtained.

In this way it is possible to automate the method because a strip of a very large length can be used, eventually supplied from a reel. The strip is transported step by step through the mould so that an intermittent continuous process is possible. That offers the possibility first to position the chips or crystals onto the same strip and bond them to said strip and thereafter carry out the encapsulating process with the same strip followed by cleaning and if necessary further hardening of the plastic material.

Preferably moulds are used of the type described in the copending Dutch Patent Application No. 82,03255. It is however also conceivable to use the same method with a mould which does not comprise a hard layer or a mould having means assisting the release of the plastic material.

The advantage of the invention is that automation is possible, that very short cycle periods can be realized with only a small amount of waste if each mould cavity has his own injection cylinder, for instance connected to the side edge of the row of moulds. If a predetermined plastic powder unit (pallet) is supplied through each injection cylinder, then the dosage of the amount of plastic per mould is very accurate whereas, as result of the positioning of the cylinder adjacent to the mould, a very short sprue is used. The plastic powder unit (pallet) therefore can have only a volume corresponding to the combined volume of the mould and the sprue. It is therefore possible to treat very small components and use very small amounts of plastic, especially in a mould which is coated with nitride.

Because of the nitride coating and the special configuration of the mould described in the copending application No. 82,3253, extremely small components can be encapsulated with good results.

The invention furthermore relates to a system for carrying out the method according to the invention which system comprises at least one row of aligned adjoining mould cavities of a mould with two sections, which can be moved away from each other, which mould cavities have a mutual distance equal to the pitch between the elements of the supplied strip of elements, said system comprising means for step by step transporting said strip and for opening and closing said mould such that a section of said strip is enclosed in or released from said mould, said system comprising furthermore means to inject plastic material into the mould cavities.

In a preferred embodiment of the system each mould cavity has its own plastic supplying device each connected to the side edge of the row of mould cavities. In that case very short sprues can be obtained.

According to a further preferred embodiment of the invention each supplying device has a press cylinder with a loading chamber which in the retracted position of the press piston of said cylinder offers space to a plastic powder unit of which the volume is equal to the volume of plastic to be injected and whereby furthermore the stroke of the piston of the press cylinder can be adjusted to compensate for differences in volume of the powder units and to adapt the volume to different moulds. Following the row of mould cavities a device can be installed which in association with the operation of the mould cleans the components of the strip received from the mould by removing sprue elements not belonging to the encapsulation.

BRIEF DESCRIPTION OF THE DRAWINGS

The invention will now be explained in more detail with reference to the drawings in which:

FIG. 2 is a schematical transverse cross section of the mould together with the injection device, and FIG. 3 illustrates in a schematic way the configuration of the injection device between other devices.

DESCRIPTION OF THE PREFERRED EMBODIMENTS

Figure 1:
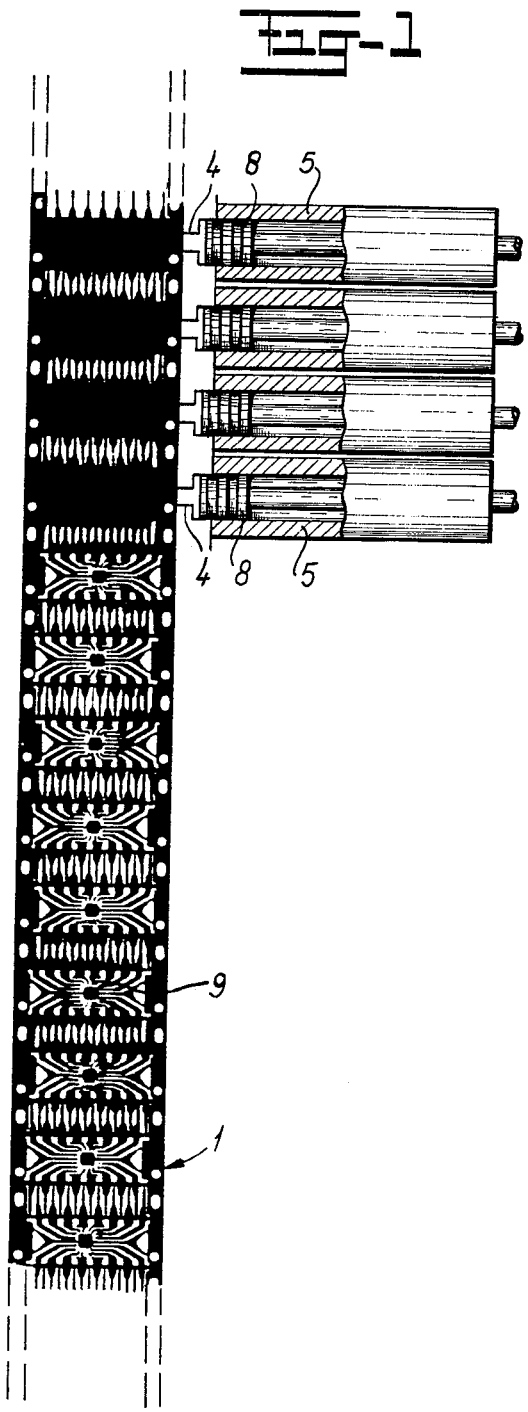
FIG. 1 is a schematical top view, partly in cross section, illustrating the injection method.

In the FIGS. 1 and 2 is illustrated a strip 1 of chip carrying elements 11 positioned in a mould 2, for instance a mould as described in the copending Dutch Patent Application No. 82,03255, whereby the connecting pins of the elements are mutually turn and turn dislocated.

The plastic material 3 is brought into the loading chamber in the form of pills through the supply unit 7. The powder unit in the form of a pill, brought into the supply unit 7 is fluidized because the adjoining mould parts 2 and 2' are heated whereafter the plastic material is through the sprue 4 injected into the mould cavity 6, in which mould cavity 6 the parts of the strip 1 to be encapsulated are positioned. Because the stroke volume of the piston 8 is adjustable the injected amount of plastic encapsulating the element in the mould can be adjusted. After hardening and releasing from the mould an electronic component is obtained connected to a sprue element and to a lump of plastic remaining in the cylinder.

Said sprue element has minimum dimensions and comprises a minimum amount of material, however, it is always necessary to work with a sprue because of changes in the grain size of the plastic powder, so that the volume cannot be determined with great accuracy. With the described method however one obtains the result that the dosage is more accurate than with the usual central injection system, resulting in a decreased material waste.

The mould may comprise several sections with a length corresponding to the length of an element 11. Each mould has an own injection cylinder 5, schematically indicated in FIG. 3 with the reference number 9.

In FIG. 3 some devices in the neighbourhood of the injection device are illustrated. The chips or crystals and the connecting pins are mounted onto the strip at 8. The strip may be received from a supply reel and transported to the area 8, in which also bonding takes place, whereafter the strip is transported into the described device 9 for encapsulating into plastic. Thereafter the elements, encapsulated in the device 9, can be cleaned of superfluous plastic, the sprue elements, in the device 10. Because as a result of the method according to the invention the encapsulating in plastic can take place continuously and intermittently without the necessity to cut the strip into sections, also the supply of elements and the removal of the superfluous plastic can be carried out in a continuous (intermittent) way, so that an automated production can be realized.

What is claimed is:

1. System for encapsulating electronic components in a plastic material, which components are connected to one or more lead frames for carrying a plurality of said components for placement in one or more parallel rows in mold cavities of a mold including a lower part and an upper part which can be moved away from each other to allow said one or more lead frames to be placed into the mold and, after encapsulation, to be removed from the mold, and which can be moved against each other to close the mold cavities for injection of said plastic material into the mold cavities to surround said components;

wherein said injection takes place through a plurality of sprues which extend from a side wall of the mold adjacent to each mold cavity, parallel to a horizontal plane extending through said row of cavities; and wherein the sprues of said mold cavities are operatively connected to a plurality of injection cylinders positioned separate from the mold and each having a loading chamber with a supply opening for the plastic material, and a piston positioned within the loading chamber so that the piston reciprocates in substantially the same horizontal plane as the sprue, and so that when the piston is in a retracted position within the loading chamber, the loading chamber offers space to a plastic powder unit, the volume of which is equal to the volume of the plastic to be injected.

2. System according to claim 1 wherein the sprue of each mold cavity is connected to a different one of the plurality of injection cylinders.

3. System according to claim 1 wherein the retraction of the piston of each injection cylinder is independent of the retraction of the piston of each other injection cylinder.

4. System according to claim 3 wherein the retraction of each piston is separately adjustable.

5. System according to claim 1 which further comprises a means following the row of cavities of the mold, for cleaning the components on the one or more lead frames received from the mold by removing sprue elements not part of the encapsulation.

6. System according to claim 1 wherein said one or more lead frames are transported to and from said mold cavities step by step, in an intermittent and continuous movement.

7. System according to claim 6 wherein said transporting is interrupted for a period of time substantially equal to the time required to inject said plastic material into said mold cavities, plus the time required for said plastic material to harden.

8. System according to claim 1 wherein said mold parts contact each other in a plane upon closing, and wherein said contact plane is generally parallel to the plane of said injection cylinders.

* * * * *